United States Patent
Levy et al.

(10) Patent No.: US 12,092,766 B2
(45) Date of Patent: *Sep. 17, 2024

(54) INJECTION LOCKED ON-CHIP LASER TO EXTERNAL ON-CHIP RESONATOR

(71) Applicant: GM Cruise Holdings LLC, San Francisco, CA (US)

(72) Inventors: Jacob Levy, Sierra Madre, CA (US); Ayan Chakrabarty, Glendora, CA (US); Vala Fathipour, Pasadena, CA (US); Karim El Amili, Arcadia, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 67 days.

This patent is subject to a terminal disclaimer.

(21) Appl. No.: 17/962,728

(22) Filed: Oct. 10, 2022

(65) Prior Publication Data

US 2023/0036316 A1 Feb. 2, 2023

Related U.S. Application Data

(63) Continuation of application No. 16/836,302, filed on Mar. 31, 2020, now Pat. No. 11,467,262.

(51) Int. Cl.
*G01C 3/08* (2006.01)
*G01S 7/484* (2006.01)
(Continued)

(52) U.S. Cl.
CPC ............. *G01S 7/484* (2013.01); *G01S 17/34* (2020.01); *H01S 5/06206* (2013.01)

(58) Field of Classification Search
CPC ....... G01S 7/484; G01S 17/34; H01S 5/06206
See application file for complete search history.

(56) References Cited

U.S. PATENT DOCUMENTS 11,467,262 B2 * 10/2022 Levy .................... H01S 5/06206
2018/0375583 A1 * 12/2018 Wang ...................... H04J 14/02
(Continued)

FOREIGN PATENT DOCUMENTS

WO   WO 2016164435 A1 * 10/2016 ........... H01S 5/1032
WO   2020191086 A1   9/2020

OTHER PUBLICATIONS

"Notice of Allowance and Fees Due for U.S. Appl. No. 16/836,302", Mailed Date: Jun. 9, 2022, 7 pages.
(Continued)

*Primary Examiner* — Mark Hellner

(57) ABSTRACT

Various technologies described herein pertain to injection locking on-chip laser(s) and external on-chip resonator(s). A system includes a first integrated circuit chip and a second integrated circuit chip. The first integrated circuit chip and the second integrated circuit chip are separate integrated circuit chips and can be optically coupled to each other. The first integrated circuit chip includes a laser configured to emit light via a first path and a second path. The second integrated circuit chip includes a resonator formed of an electrooptic material. The resonator can receive the light emitted by the laser of the first integrated circuit chip via the first path and return feedback light to the laser of the first integrated circuit chip via the first path. The feedback light can cause injection locking of the laser to the resonator to control the light emitted by the laser (e.g., via the first and second paths).

19 Claims, 10 Drawing Sheets

(51) Int. Cl.
*G01S 17/34* (2020.01)
*H01S 5/062* (2006.01)

(56) References Cited

U.S. PATENT DOCUMENTS

2019/0146091 A1* 5/2019 Matsko .................. H01S 5/141
356/5.01
2021/0302539 A1 9/2021 Levy et al.

OTHER PUBLICATIONS

Lihachev, et al., "Low-Noice, Frequency-Agile, Hybrid Integrated Lasers for LiDAR", In CLEO, 2021, 2 pages.

* cited by examiner

INJECTION LOCKED ON-CHIP LASER TO EXTERNAL ON-CHIP RESONATOR

RELATED APPLICATION

This application is a continuation of U.S. patent application Ser. No. 16/836,302, filed on Mar. 31, 2020, and entitled "INJECTION LOCKED ON-CHIP LASER TO EXTERNAL ON-CHIP RESONATOR", the entirety of which is incorporated herein by reference.

BACKGROUND

Various conventional architectures employ a laser that is injection locked to a resonator. For instance, the laser can emit light that is sent to the resonator. The laser and the resonator are optically coupled, such that the light from the laser is provided to the resonator, circulates inside the resonator undergoing total internal reflection, and is provided back from the resonator to the laser. When self-injection locked, the frequency of the laser is a slave to the frequency of the resonator (e.g., the resonator can cause the laser to emit light at substantially similar frequency as compared to the frequency of the resonator) and a linewidth of the light emitted by the laser can be reduced as compared to a laser that is not injection locked.

A frequency modulated continuous wave (FMCW) laser source can include a laser that is injection locked to a resonator. For instance, an FMCW laser source can be utilized as part of an FMCW lidar sensor system. Such FMCW lidar sensor system can be used for perception of range and velocity of a moving target. By way of illustration, an autonomous vehicle can include an FMCW lidar sensor system; the FMCW lidar sensor system of the autonomous vehicle can capture data pertaining to range and velocity of object(s) within a driving environment nearby the autonomous vehicle. Accordingly, it is desirable to narrow a linewidth of light emitted by an FMCW laser source while reducing size and weight of such laser source.

Some conventional resonators that can be utilized for injection locking are discrete components that can be in optical communication with the laser. Due to electrooptic properties and sizes of such resonators, frequency of light circulating in a resonator can be linearly modulated. According to an example, voltage in a sawtooth waveform can be applied to the resonator to cause the laser injection locked to the resonator to emit a light beam with a frequency that follows the sawtooth waveform (e.g., an optical chirp). However, conventional discrete resonators may be difficult to manufacture and may be relatively large in size. Further, conventional discrete resonators, due to typical sizes, may support a plurality of modes. Since such resonators can support a number of higher order modes, it is often difficult to injection lock the laser to the fundamental mode of the resonators.

Moreover, various conventional laser architectures include two integrated circuit chips that are coupled to each other. For example, in some traditional chip-to-chip coupled architectures, a first integrated circuit chip includes a laser and a second integrated circuit chip includes various optical components; however, in these architectures, light is outputted by the second integrated circuit chip (e.g., the second integrated circuit chip does not provide feedback to the first integrated circuit chip). Following this example, the laser is not injection locked to component(s) of the second integrated circuit chip. According to other examples where chip-to-chip coupling is employed, a first integrated circuit chip formed of a broadband gain material with a first mirror can be coupled to a second integrated circuit chip, where the second integrated circuit chip includes a second mirror; thus, the first integrated circuit chip and the second integrated circuit chip in combination forms a laser. However, by itself, the broadband gain material with the first mirror of the first integrated circuit chip is not a laser source. The gain material that is part of the first integrated circuit chip cannot function as a laser source until coupled with the second mirror of the second integrated circuit chip. Following this example, a hybrid laser is provided across the two integrated circuit chips. Accordingly, the foregoing conventional chip-to-chip coupled architectures may rely on linearly ramping laser current to create optical chirps for an FMCW lidar sensor system.

SUMMARY

The following is a brief summary of subject matter that is described in greater detail herein. This summary is not intended to be limiting as to the scope of the claims.

Described herein are various technologies that pertain to injection locking an on-chip laser and an external on-chip resonator. According to various embodiments, a system can include a first integrated circuit chip and a second integrated circuit chip. The first integrated circuit chip and the second integrated circuit chip are separate integrated circuit chips. The first integrated circuit chip can be optically coupled with the second integrated circuit chip. The first integrated circuit chip includes a laser configured to emit light via a first path and a second path (e.g., the first path and the second path can be a first waveguide and a second waveguide). The second integrated circuit chip includes a resonator formed of an electrooptic material. The resonator can be configured to receive the light emitted by the laser of the first integrated circuit chip via the first path and return feedback light to the laser of the first integrated circuit chip via the first path. The feedback light can cause injection locking of the laser to the resonator to control the light emitted by the laser (e.g., via the first path and the second path). Controlling the light emitted by the laser includes controlling one or more spectral properties of the light emitted by the laser.

According to various embodiments, the first integrated circuit chip can further include a lidar optical engine. The lidar optical engine can include one or more lidar components. Examples of the lidar components include a splitter, an optical amplifier, an output, a return, an interferometer, a balanced detector, and the like. The light emitted by the laser via the second path can be inputted to the lidar optical engine. However, it is contemplated that the first integrated circuit chip can include other components if the light being emitted by the laser is used for an application other than lidar.

In accordance with various embodiments, the resonator of the second integrated circuit chip can be optically coupled to the laser of the first integrated circuit chip, where the resonator has an add/drop resonator configuration. The second integrated circuit chip can further include a mirror and a waveguide, where an end of the waveguide is configured to be optically coupled to the first integrated circuit chip. The mirror can be, for example, a loop mirror, a Bragg mirror, or a facet mirror. The mirror can provide additional feedback to the laser to enhance efficiency of the injection lock. In the add/drop resonator configuration, the resonator can include a first coupling region evanescently coupled to the waveguide, and a second coupling region evanescently coupled to the mirror.

Moreover, pursuant to various embodiments, the first integrated circuit chip can include a plurality of lasers and the second integrated circuit chip can include a plurality of resonators. More particularly, the first integrated circuit chip can include at least a first laser and a second laser. Further, the second integrated circuit chip can include at least a first resonator and a second resonator. The first resonator and the second resonator can be formed of an electrooptic material. The first resonator can be configured to receive light emitted by the first laser of the first integrated circuit chip and return feedback light to the first laser of the first integrated circuit chip. The feedback light returned by the first resonator can cause injection locking of the first laser to the first resonator to control light emitted by the first laser. Moreover, the second resonator can be configured to receive light emitted by the second laser of the first integrated circuit chip and return feedback light to the second laser of the first integrated circuit chip. The feedback light returned by the second resonator can cause injection locking of the second laser to the second resonator to control the light emitted by the second laser. The first integrated circuit chip can further include a plurality of lidar optical engines. For instance, the first integrated circuit chip can include at least a first lidar optical engine and a second lidar optical engine. Accordingly, the light emitted by the first laser can be inputted to the first lidar optical engine and the light emitted by the second laser can be inputted to the second lidar optical engine. Thus, pursuant to such embodiments, the first integrated circuit chip and the second integrated circuit chip can provide multiple channels.

Further, according to various embodiments, the second integrated circuit chip can include a resonator that can be optically coupled to more than one laser of the first integrated circuit chip. Accordingly, the resonator can be configured to receive light emitted by a first laser of the first integrated circuit chip and return feedback light to the first laser of the first integrated circuit chip, where the feedback light returned by the resonator can cause injection locking of the first laser to the resonator to control light emitted by the first laser. Moreover, the resonator can also be configured to receive light emitted by a second laser of the first integrated circuit chip, where the feedback light returned by the resonator can cause injection locking of the second laser to the resonator to control the light emitted by the second laser.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
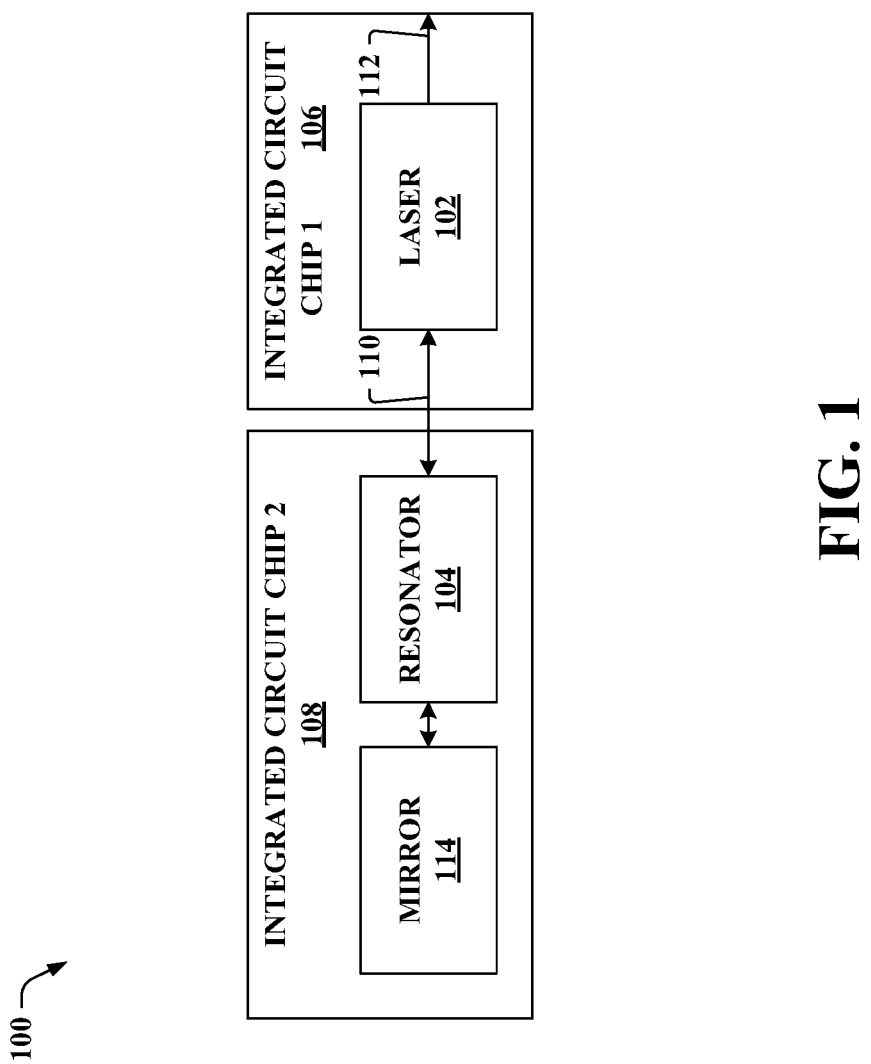
FIG. 1 illustrates an exemplary system configured to injection lock a laser to a resonator, where a first integrated circuit chip includes the laser and a second integrated circuit chip includes the resonator.

Various technologies pertaining to on-chip laser(s) injection locked to external on-chip resonator(s) are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. The terms "component" and "system" are also intended to encompass one or more optical elements that can be configured or coupled together to perform various functionality with respect to an optical signal. It is also to be understood that a component or system may be localized on a single device or distributed across several devices. Further, as used herein, the term "exemplary" is intended to mean "serving as an illustration or example of something."

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

As used herein, and unless the context dictates otherwise, the term "coupled to" is intended to include both direct coupling (in which two elements that are coupled to each other contact each other) and indirect coupling (in which at least one additional element is located between the two elements).

Referring now to the drawings, FIG. 1 illustrates an exemplary system 100 configured to injection lock a laser 102 to a resonator 104. The system 100 includes a first integrated circuit chip 106 and a second integrated circuit chip 108. The first integrated circuit chip 106 and the second integrated circuit chip 108 are separate integrated circuit chips. Moreover, the first integrated circuit chip 106 and the second integrated circuit chip 108 can be optically coupled with each other. The first integrated circuit chip 106 includes the laser 102. Further, the second integrated circuit chip 108 includes the resonator 104.

The laser 102 can be heterogeneously integrated on the first integrated circuit chip 106. The laser 102 of the first integrated circuit chip 106 is configured to emit light in two directions. Thus, the laser 102 can emit light via a first path 110 and a second path 112. The first path 110, for instance, can include a first waveguide of the first integrated circuit chip 106 and the second path 112 can include a second waveguide of the first integrated circuit chip 106. The laser 102 can be a semiconductor laser, for instance. According to various examples, the laser 102 can be a distributed feedback (DFB) laser, a distributed Bragg reflector (DBR) laser, a Fabry Perot laser, or the like.

The resonator 104 is configured to receive the light emitted by the laser 102 of the first integrated circuit chip 106 via the first path 110 and return feedback light to the laser 102 of the first integrated circuit chip 106 via the first path 110. The light received by the resonator 104 can circulate inside the resonator 104 undergoing total internal reflection. The feedback light can cause injection locking of the laser 102 to the resonator 104 to control the light emitted by the laser 102; thus, the feedback light from the resonator 104 can control the light emitted by the laser 102 via the first path 110 and the second path 112. Controlling the light emitted by the laser 102 includes controlling one or more spectral properties of the light emitted by the laser 102. Changing the one or more spectral properties of the light emitted by the laser 102 via injection locking can produce a narrow linewidth, low noise laser source.

The resonator 104 is formed of an electrooptic material. Examples of the electrooptic material from which the resonator 104 can be formed include lithium niobate and lithium tantalate. For instance, the resonator 104 can be fabricated from a lithium niobate on insulator (LNOI) platform. Other examples of the electrooptic material from which the resonator 104 can be formed include materials that are oftentimes dielectric but are processed to cause such materials to be electrooptic; for instance, strained silicon (where strain on the silicon provides an electrooptic effect) can be used as the electrooptic material from which the resonator 104 can be formed. According to an illustration, a substrate of the second integrated circuit chip 108 can be formed of silicon, an oxide buffer layer can be formed above the substrate, and the electrooptic material from which the resonator 104 is formed can be bonded above the oxide buffer layer; yet, the claimed subject matter is not so limited.

The laser 102 is optically injection locked to the resonator 104. Since the laser 102 is optically injection locked to the resonator 104, a voltage applied across the resonator 104 can impart a frequency change on the laser 102 as well as a linewidth reduction. Injection locking of the laser 102 to the resonator 104 can narrow a linewidth of light emitted by the laser 102. Accordingly, the voltage applied to the resonator 104 can be utilized to control frequency of the injection locked light outputted by the laser 102. The injection locked light (e.g., the emitted light), for instance, can be or include an optical chirp for a lidar sensor system generated by applying a voltage waveform across the resonator 104.

Moreover, the second integrated circuit chip 108 can include a mirror 114 optically coupled to the resonator 104. The mirror 114 can be a loop mirror, a Bragg mirror, a facet mirror, or the like. The mirror 114 can provide additional feedback to the laser 102. For instance, the mirror 114 can act as a filter, which can reflect light that can be coupled back to the resonator 104 (and further provided back to the laser 102). Such additional feedback can increase an efficiency of the injection locking of the laser 102 to the resonator 104. The mirror 114 can be tunable, for example; following this example, the mirror 114 can include electrodes that can be used to control an amount of light that is returned by the mirror 114.

As described in greater detail herein, the second integrated circuit chip 108 can further include electrode(s) adjacent to the resonator 104; accordingly, a voltage can be applied to such electrode(s). Application of a voltage to the electrode(s) across the resonator 104 can change an optical property of the electrooptic material of the resonator 104. For instance, application of a voltage across the resonator 104 can change an index of refraction of the electrooptic material of the resonator 104.

The on-chip laser 102 can be coupled with the high quality factor (Q) external resonator 104 (e.g., external cavity) through chip-to-chip coupling of the first integrated circuit chip 106 and the second integrated circuit chip 108. Self-injection locking of the laser 102 to the resonator 104 can provide a low-noise, narrow linewidth light source. Thus, the system 100 can provide an injection locking mechanism that can reduce linewidth of the light outputted by the laser 102, which can increase a coherence range of the system 100 (e.g., a lidar sensor system that includes the system 100).

When self-injection locked, a frequency of emitted light from the laser 102 can coincide with a frequency of a waveguide mode (WGM) of the resonator 104. Since the resonator material is electrooptic, the voltage applied across the resonator 104 can be utilized to change the frequency of the waveguide mode, and thus, can modulate the frequency of the light outputted by the laser 102. Accordingly, the system 100 can be utilized to provide a frequency modulated continuous wave (FMCW) laser source. The FMCW laser source can be controlled by applying an electric field to the resonator 104 at different rates or in varying patterns. The FMCW laser source can have high spectral purity. Thus, the system 100 (e.g., the FMCW laser source) can be utilized for various applications such as lidar, optical metrology, high bitrate optical communication, high-resolution optical sensing, optical coherence tomography (OCT), other biomedical sensors, or the like. For example, a lidar sensor system (e.g., of an autonomous vehicle) can include the system 100. Following this example, the laser 102 injection locked to the resonator 104 can be an FMCW laser source configured to generate an optical chirp (e.g., the injection locked light) for the lidar sensor system; yet, it is also contemplated that the system 100 can also be used as part of other systems that use compact, narrow linewidth lasers.

The system 100 can provide an FMCW laser source that can be used for perception of range and velocity of a moving target. Accordingly, the system 100 can provide an integrated, low noise, narrow linewidth, frequency modulated laser source on the first integrated circuit chip 106 and the second integrated circuit chip 108. For instance, use of the system 100 as part of a lidar sensor system can lead to reduction in costs, size, weight, and/or power consumption of the lidar sensor system relative to conventional lidar sensor systems. Moreover, the on-chip laser 102 can be stabilized by self-injection locking to the on-chip extended cavity (e.g., the resonator 104). The extended cavity can be a high Q resonator 104 fabricated out of electrooptic material and can have electrodes for frequency modulation. Moreover, in addition to linewidth narrowing and stabilization, the scalable on-chip extended cavity can reduce size and weight of the FMCW laser by orders of magnitude as well as can reduce manufacturing costs by enabling large-scale manufacturing.

Accordingly, the system 100 can be (or be included in) an on-chip FMCW laser source. Moreover, an FMCW laser source that includes the system 100 can have a reduced size or weight relative to conventional laser sources. Further, power consumption can be reduced utilizing the FMCW laser source that includes the system 100 relative to conventional approaches. As described in greater detail below, it is also contemplated that the techniques set forth herein can be scalable for multi-channel output.

Figure 2:
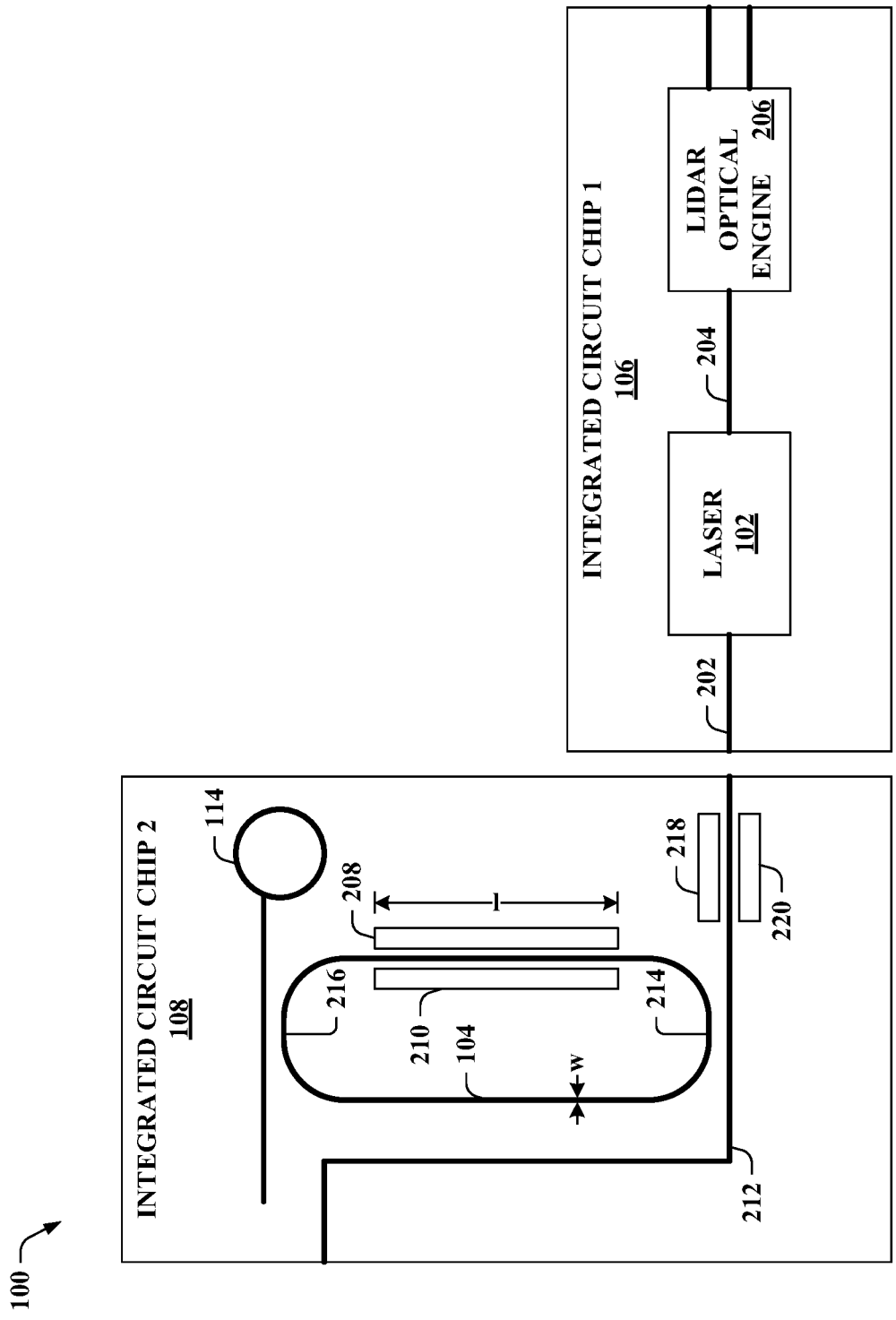
FIGS. 2-5 illustrate exemplary embodiments of the system that includes the first integrated circuit chip and the second integrated circuit chip of FIG. 1.

Now turning to FIG. 2, illustrated is an exemplary embodiment of the system 100 that includes the first integrated circuit chip 106 and the second integrated circuit chip 108. Again, the first integrated circuit chip 106 includes the laser 102, and the second integrated circuit chip 108 includes the resonator 104 and the mirror 114. The laser 102 is configured to emit light via a first path and a second path; as depicted in FIG. 2, the laser 102 is configured to emit light in a first direction via a first waveguide 202 and in a second direction via a second waveguide 204. The light emitted by the laser 102 in the first direction via the first waveguide 202 can be sent to the resonator 104. More particularly, the waveguide 202 can end with a facet or edge coupler that can be butt coupled to the second integrated circuit chip 108 that stages the external cavity (e.g., the resonator 104).

The first integrated circuit chip 106 can further include a lidar optical engine 206. The lidar optical engine 206 can include one or more lidar components. For instance, the lidar optical engine 206 can include lidar components such as a splitter, an optical amplifier, an output, a return, an interferometer, a balanced detector, a combination thereof, and so forth on the same platform as the laser 102 (e.g., on the first integrated circuit chip 106). The light emitted by the laser 102 in the second direction via the second waveguide 204 (e.g., injection locked to the resonator 104) can be inputted to the lidar optical engine 206; thus, the injection locked light from the laser 102 can be inputted to the lidar optical engine 206 via the second path. While many of the examples described herein provide the first integrated circuit chip 106 including lidar optical engine(s), is to be appreciated that other types of components can additionally or alternatively be included as part of the first integrated circuit chip 106 depending on the application for which the system 100 is being utilized.

The resonator 104 of the second integrated circuit chip 108 can be a single mode optical resonator. In contrast, in some conventional approaches, a resonator injection locked to a laser includes one or more higher order modes. Since the resonator 104 of the second integrated circuit chip 108 can be a single mode optical resonator, such resonator 104 supports injection locking to the fundamental mode a priori.

Moreover, the resonator 104 can be or include a closed-loop waveguide. The closed-loop waveguide, for instance, can include bent sections and/or straight sections. The dimensions of the sections of the closed-loop waveguide can be set such that the resonator 104 supports a single optical mode. A width of the waveguide forming the resonator 104 (denoted w in FIG. 2, also referred to as the width of the resonator 104), for instance, can be in a range from 1 micron to 3 microns. Due to the width of the resonator 104, a stronger field can result across the width of the resonator 104 as compared to conventional, larger resonators (assuming the same voltage is applied across the resonators). However, the claimed subject matter is not so limited as other widths of the resonator 104 are intended to fall within the scope of the hereto appended claims.

The second integrated circuit chip 108 further includes electrodes 208-210 adjacent to the resonator 104. The electrodes 208-210 and the resonator 104 can be located in a common plane (above a top surface of a substrate of the second integrated circuit chip 108). According to an example, the electrodes 208-210 can be directly coupled to the resonator 104 (e.g., the electrodes 208-210 can be on the waveguide without space or other material between the electrodes 208-210 and the resonator 104). Pursuant to another example, the electrodes 208-210 can be indirectly coupled to the resonator 104 (e.g., space and/or other material can be positioned between at least one of the electrodes 208-210 and the resonator 104). Since the electrodes 208-210 are adjacent to the resonator 104, a change in voltage applied across the electrodes 208-210 can cause a corresponding change in frequency of a waveguide mode of the resonator 104.

It is to be appreciated that the electrodes 208-210 can be substantially any length (denoted l in FIG. 2). For instance, longer electrodes 208-210 can allow for more effectively controlling the change in index of refraction of the resonator 104.

While the electrodes 208-210 shown in FIG. 2 are illustrated as being in a common plane with the resonator 104 relative to a top surface of a substrate of the second integrated circuit chip 108, in other embodiments it is to be appreciated that the electrodes 208-210 can be vertically stacked with the resonator 104. For instance, a first electrode can be beneath the resonator 104 and a second electrode can be above the resonator 104 relative to the top surface of the substrate of the second integrated circuit chip 108.

The resonator 104 can be coupled to the laser 102, where the resonator 104 has an add/drop resonator configuration. The second integrated circuit chip 108 can further include a waveguide 212 as well as the mirror 114. An end of the waveguide 212 is configured to be optically coupled to the first integrated circuit chip 106 (e.g., a facet or edge coupler can be at the end of the waveguide 212). More particularly, the end of the waveguide 212 is configured to be optically coupled to the end of the waveguide 202 of the first integrated circuit chip 106 (e.g., the waveguide 212 and the waveguide 202 are to be aligned such that light can propagate there between). Moreover, the resonator 104 (having the add/drop resonator configuration) includes a first coupling region 214 evanescently coupled to the waveguide 212 and a second coupling region 216 evanescently coupled to the mirror 114. The first coupling region 214 and the second coupling region 216 can be designed to provide desired coupling strengths between the resonator 104 and the waveguide 212 as well as between the resonator 104 and the mirror 114. Thus, an add port of the resonator 104 (e.g., the first coupling region 214) can end on a facet to be coupled with the first integrated circuit chip 106 (e.g., the end of the waveguide 212). Further, an output of the drop port of the resonator 104 (e.g., the second coupling region 216) can include the mirror 114 (e.g., a loop mirror, a Bragg mirror, a facet mirror, or the like). As noted above, the mirror 114 can provide additional feedback to the laser 102 to increase the efficiency of the injection lock.

A detector (e.g., photodiode) (not shown) can be coupled to the waveguide 212. The detector can allow for detecting whether the first integrated circuit chip 106 and the second integrated circuit chip 108 are aligned.

Further, the second integrated circuit chip 108 can include electrodes 218-220 adjacent to the waveguide 212. Similar to the electrodes 208-210, the electrodes 218-220 can be directly coupled or indirectly coupled to the waveguide 212. Moreover, the electrodes 218-220 and the waveguide 212 can be in a common plane relative to the top surface of the substrate of the second integrated circuit chip 108; yet, it is also contemplated that the electrodes 218-220 and the waveguide 212 can alternatively be vertically stacked relative to the top surface of the substrate of the second integrated circuit chip 108. A change in voltage applied across the electrodes 218-220 can cause a corresponding phase shift of the feedback light returned to the laser 102 of the first integrated circuit chip 106. The change in voltage applied across the electrodes 218-220 can change a refractive index of the waveguide 212, which can change a delay of light traveling through a section of the waveguide 212. Thus, by adding the electrodes 218-220, the add port may be coupled to a phase shifter to facilitate injection locking.

The laser 102 on the first integrated circuit chip 106 is injection locked to the extended cavity (e.g., the resonator 104) on the second integrated circuit chip 108, which provides feedback light to the laser 102. As described herein, self-injection locking of the laser 102 to the high Q cavity (e.g., the resonator 104) can reduce laser linewidth and noise by orders of magnitude as compared to various conventional approaches. Chip-to-chip alignment is used to enable such feedback between the resonator 104 and the laser 102 (e.g., the waveguide 212 of the second integrated circuit chip 108 is to be aligned with the waveguide 202 of the first integrated circuit chip 106). Moreover, anti-reflection coatings and index matching epoxy can be utilized to mitigate chip facet reflection and mitigate loss. While being shown as separated in FIG. 2, it is to be appreciated that the first integrated circuit chip 106 and the second integrated circuit chip 108 can be directly connected to each other.

Figure 3:
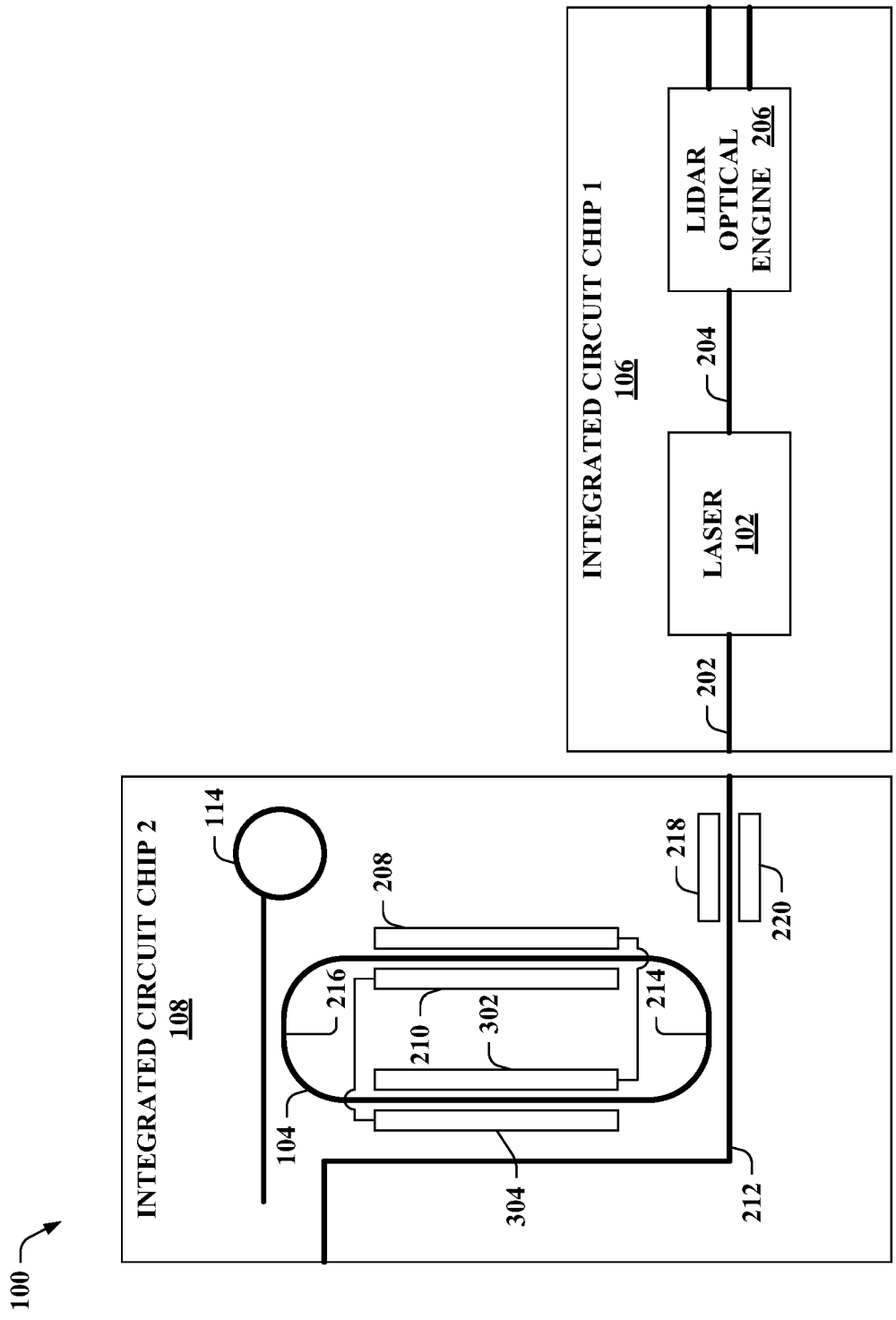

Now turning to FIG. 3, illustrated is another exemplary embodiment of the system 100 including the first integrated circuit chip 106 and the second integrated circuit chip 108. Similar to above, the first integrated circuit chip 106 can include the laser 102, the waveguides 202-204, and the lidar optical engine 206. Moreover, the second integrated circuit chip 108 can include the resonator 104, the mirror 114, the waveguide 212, the electrodes 208-210 adjacent to the resonator 104, and the electrodes 218-220 adjacent to the waveguide 212.

In addition to the electrodes 208-210 adjacent to the resonator 104, the second integrated circuit chip 108 can also include another set of electrodes 302-304 adjacent to the resonator 104. Similar to the electrodes 208-210, the electrodes 302-304 can be directly or indirectly coupled to the resonator 104. Moreover, as depicted in FIG. 3, the resonator 104, the electrodes 208-210, and the electrodes 302-304 can be in a common plane relative to the top surface of the substrate of the second integrated circuit chip 108.

According to various embodiments, the electrode 208 and the electrode 302 can be electrically connected on the second integrated circuit chip 108. Moreover, the electrode 210 and the electrode 304 can be electrically connected on the second integrated circuit chip 108. For instance, the electrode 208 and the electrode 302 can be connected to V+, and the electrode 210 and the electrode 304 to be connected to ground; however, the claimed subject matter is not so limited. By including the second set of electrodes 302-304 in the second integrated circuit chip 108, an electric field across the resonator 104 can be increased relative to the configuration depicted in FIG. 2.

Figure 4:
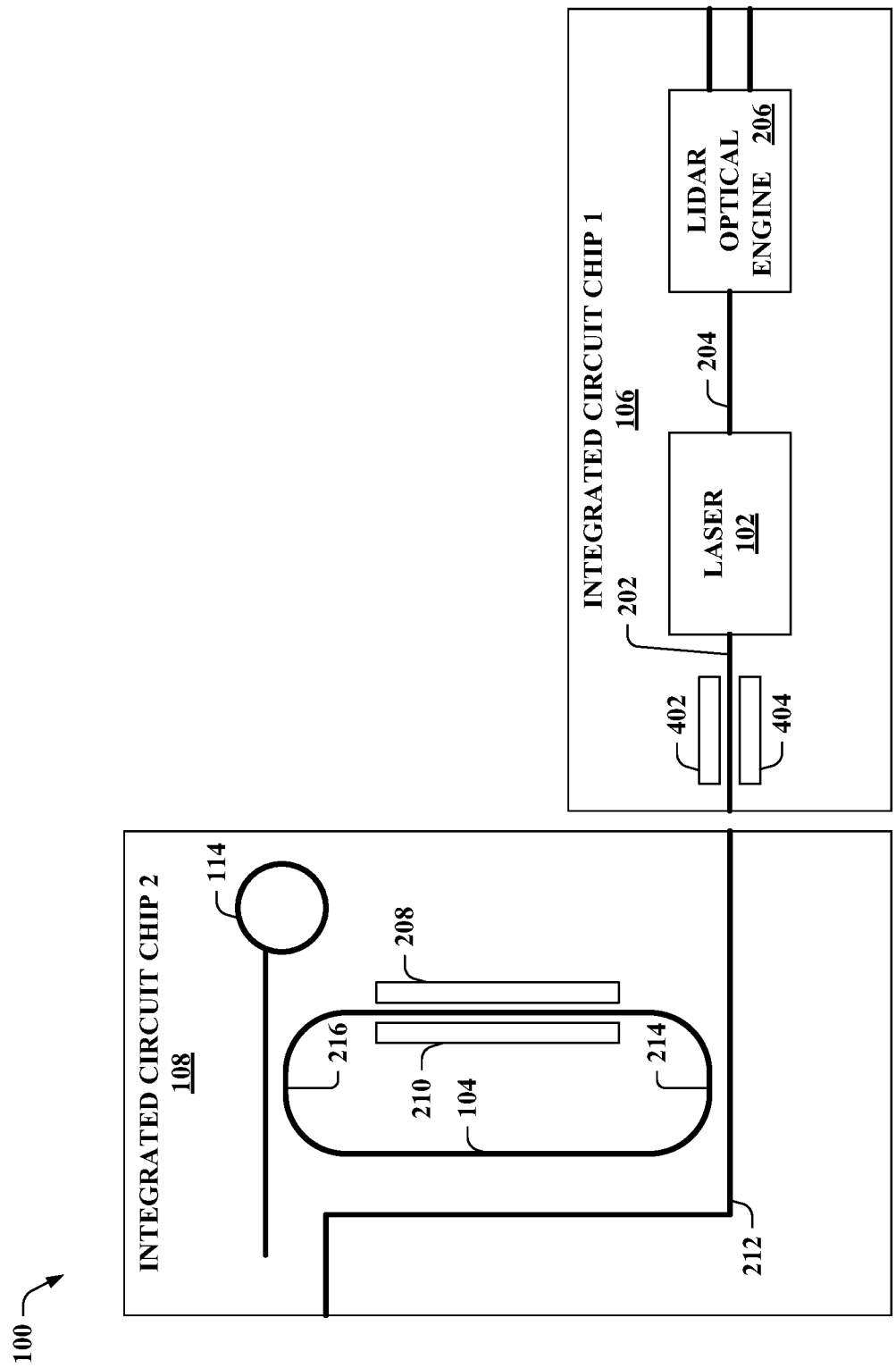

Now turning to FIG. 4, illustrated is yet another exemplary embodiment of the system 100 including the first integrated circuit chip 106 and the second integrated circuit chip 108. Similar to above, the first integrated circuit chip 106 can include the laser 102, the waveguides 202-204, and the lidar optical engine 206. Moreover, the second integrated circuit chip 108 can include the resonator 104, the mirror 114, the waveguide 212, and the electrodes 208-210 adjacent to the resonator 104. Although not shown, it is contemplated that the second integrated circuit chip 108 can further include a second set of electrodes (e.g., the electrodes 302-304) adjacent to the resonator 104.

As depicted in FIG. 4, the first integrated circuit chip 106 can include electrodes 402-404 adjacent to the waveguide 202. Similar to the electrodes 218-220 adjacent to the waveguide 212 described above, the electrodes 402-404 can be directly or indirectly coupled to the waveguide 202. Likewise, similar to the electrodes 218-220, the electrodes 402-404 can be utilized to control a phase shift of feedback light returned to the laser 102 of the first integrated circuit chip 106. According to an example, a change in voltage applied across the electrodes 402-404 can change a refractive index of the waveguide 202, which can change a delay of light traveling through a section of the waveguide 202. However, pursuant to other examples, the electrodes 402-404 can be connected to an integrated diode that can inject carriers to induce a refractive index shift or the electrodes 402-404 can be attached to a resistive heater that can dissipate heat to induce a refractive index shift.

Moreover, according to various embodiments, it is to be appreciated that the system 100 can include both sets of phase shift electrodes. Thus, in accordance with such embodiments, the first integrated circuit chip 106 can include the electrodes 402-404 adjacent to the waveguide 202, and the second integrated circuit chip 108 can include the electrodes 218-220 adjacent to the waveguide 212.

Figure 5:
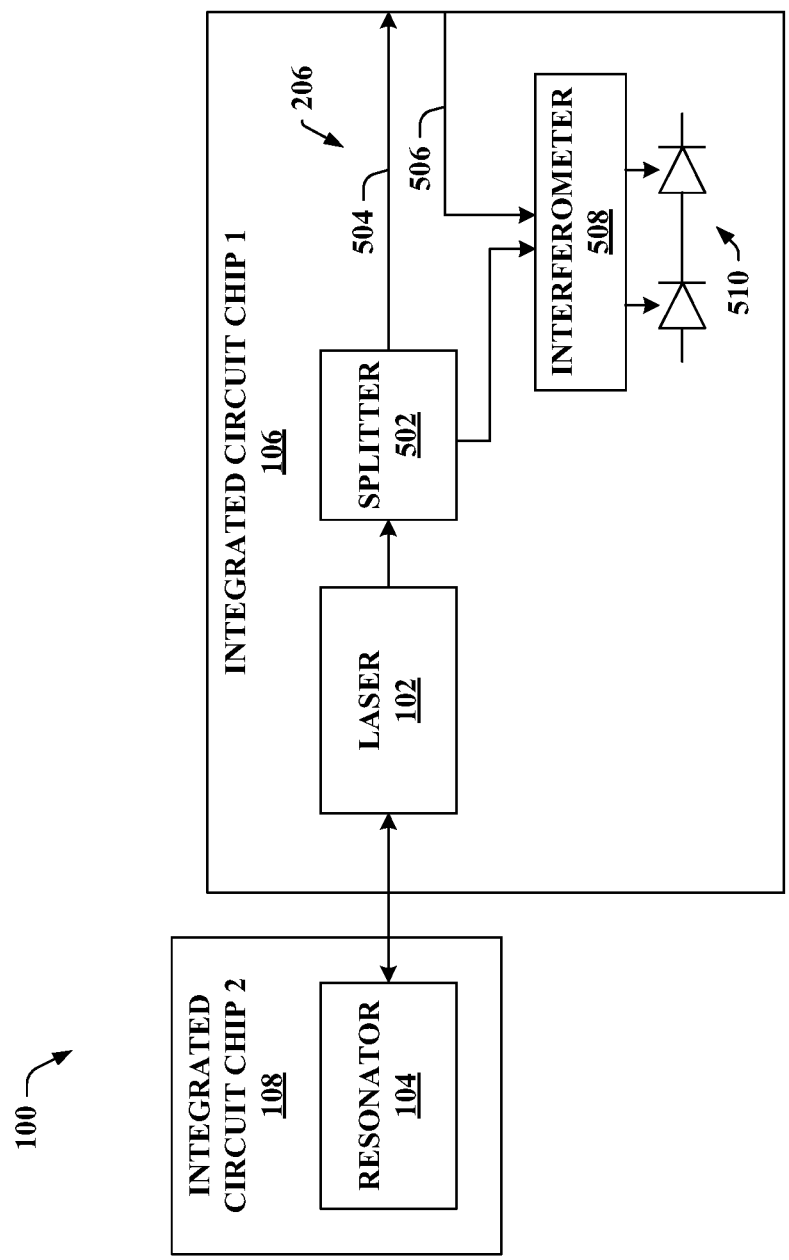

Now turning to FIG. 5, illustrated is another exemplary embodiment of the system 100 that includes the first integrated circuit chip 106 optically coupled to the second integrated circuit chip 108. More particularly, FIG. 5 shows the lidar optical engine 206 of the first integrated circuit 106 in greater detail. Similar to above, the laser 102 of the first integrated circuit chip 106 is injection locked to the resonator 104 of the second integrated circuit chip 106. Moreover, injection locked light emitted by the laser 102 is inputted to the lidar optical engine 206.

The lidar optical engine 206 can include a splitter 502, an output 504, a return 506, an interferometer 508, and a balanced detector 510. Moreover, although not shown, is to be appreciated that the lidar optical engine 206 can include other components (e.g., an optical amplifier, etc.). The splitter 502 can receive the light emitted by the laser 102 and split such light beam into an output light beam (e.g., to be transmitted into an environment via the output 504) and a local oscillator signal. A returned light beam received from the environment responsive to transmission of the output light beam (e.g., due to the output light beam being reflected by an object in the environment) can be received via the return 506. The returned light beam and the local oscillator signal can be merged by the interferometer 508, and output from the interferometer 508 can be provided to the balanced detector 510.

Figure 6:
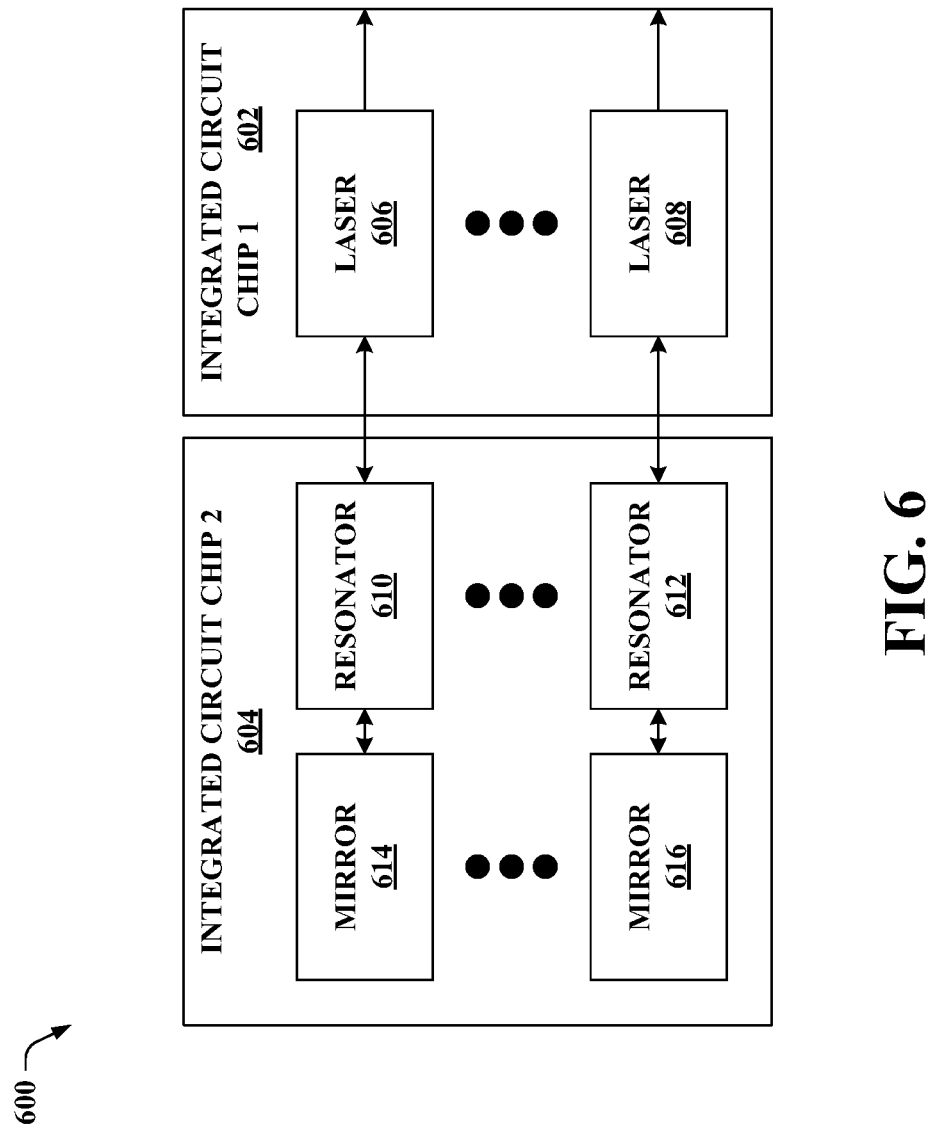
FIG. 6 illustrates an exemplary system for multiple channel, on-chip resonator to laser coupling.

Now turning to FIG. 6, illustrated is a system 600 for multiple channel, on-chip resonator to laser coupling. The system 600 includes a first integrated circuit chip 602 and a second integrated circuit chip 604. The first integrated circuit chip 602 and the second integrated circuit chip 604 are separate integrated circuit chips, which can be optically coupled to each other. The first integrated circuit chip 602 includes a plurality of lasers (e.g., an array of lasers), namely, a laser 606, . . . , and a laser 608. It is to be appreciated that the first integrated circuit chip 602 can include substantially any number of lasers 606-608. Further, the lasers 606-608 can each be substantially similar to the laser 102 described herein. Moreover, the second integrated circuit chip 604 includes a plurality of resonators (e.g., an array of resonators), namely, a resonator 610, . . . , and a resonator 612. The number of resonators 610-612 on the second integrated circuit chip 604 can equal the number of lasers 606-608 on the first integrated circuit chip 602. Further, the resonators 610-612 can each be substantially similar to the resonator 104 described herein. The resonators 610-612 can each be optically coupled to a corresponding mirror 614-616 (each substantially similar to the mirror 114 described herein).

The first integrated circuit chip 602 and the second integrated circuit chip 604 include multiple channels. For instance, a first channel can include the laser 606, the resonator 610, and the mirror 614. Further, a second channel can include the laser 608, the resonator 612, and the mirror 616. Each of the channels can be substantially similar to the channel of the first integrated circuit chip 106 and the second integrated circuit chip 108 described above in FIGS. 1-5; accordingly, the foregoing description of the single channel can be extended to the multiple channel embodiments described herein.

As described herein, the resonators 610-612 are formed of electrooptic material. The resonators 610-612 can be spaced on the second integrated circuit chip 604 at a defined pitch to couple to a same number of lasers 606-608 on the first integrated circuit chip 602 for injection locking to obtain multiple narrow linewidth, low phase noise, on-chip sources in the system 600. Accordingly, the resonator 610 is configured to receive light emitted by the laser 606 of the first integrated circuit chip 602 and return feedback light to the laser 606 of the first integrated circuit chip 602. The feedback light returned by the resonator 610 can cause injection locking of the laser 606 to the resonator 610 to control the light emitted by the laser 606. Likewise, the resonator 612 can be configured to receive light emitted by the laser 608 of the first integrated circuit chip 602 and return feedback light to the laser 608 of the first integrated circuit chip 602. The feedback light returned by the resonator 612 can cause injection locking of the laser 608 to the resonator 612 to control the light emitted by the laser 608. It is to be appreciated that other resonators of the second integrated circuit chip 604 (if the system 600 includes more than two channels) can similarly be optically coupled to other lasers of the first integrated circuit chip 602.

The first integrated circuit chip 602 can include the same number of lasers 606-608 as there are resonators 610-612 on the second integrated circuit chip 604. As described herein, the lasers 606-608 can each emit light in two directions. As described herein, outputs from the lasers 606-608 in a first direction (e.g., along a first path, via a first waveguide) can come to an edge of the first integrated circuit chip 602 with the same spacing as outputs from the resonators 610-612 of the second integrated circuit chip 604.

The second integrated circuit chip 604 can include an array of high quality factor resonators 610-612. The resonators 610-612 may be coupled in an add/drop resonator configuration, and outputs of the drop ports may be coupled to corresponding mirrors 614-616 (e.g., loop mirrors, Bragg mirrors, facet mirrors, or the like). Moreover, the second integrated circuit chip 604 can include electrodes adjacent to the resonators 610-612 to allow for applying fields across the resonator 610-612 for chirping in order to achieve frequency modulation. It is contemplated that the second integrated circuit chip 604 can include 2, 4, 8, or N resonators 610-612, where N can be substantially any integer, with outputs spaced by a fixed arbitrary distance at an edge of the second integrated circuit chip 604.

The first integrated circuit chip 602 and the second integrated circuit chip 604 can be aligned such that the outputs from the lasers 606-608 on the first integrated circuit chip 602 align to the outputs from the resonators 610-612 on the second integrated circuit chip 604 (e.g., waveguides evanescently coupled to each of the resonators 610-612). As described herein, each of the lasers 606-608 is aligned and coupled to a corresponding one of the resonators 610-612. Moreover, when aligned and with the use of anti-reflection coatings and index matching epoxy, the first integrated circuit chip 602 and the second integrated circuit chip 604 can be fixed in place such that the resonator cavities (e.g., the resonator 610-612) injection lock the lasers 606-608.

While many of the examples set forth herein describe the number of lasers 606-608 of the first integrated circuit chip 602 equaling the number of resonators 610-612 of the second integrated circuit chip 604, it is contemplated that a single resonator of the second integrated circuit chip 604 can be optically coupled to more than one laser of the first integrated circuit chip 602. According to an example, the number of lasers 606-608 can be larger than the number of resonators 610-612. Thus, the examples set forth herein to can be extended to such a scenario. Pursuant to an illustration, a single resonator (e.g., the resonator 610) of the second integrated circuit 604 can be configured to receive light emitted by a first laser (e.g., the laser 606) of the first integrated circuit chip 602 and return feedback light to the first laser of the first integrated circuit chip 602, where the feedback light returned by the resonator can cause injection locking of the first laser to the resonator to control light emitted by the first laser. Following this illustration, the same resonator (e.g., the resonator 610) can also be configured to receive light emitted by a second laser (e.g., the laser 608) of the first integrated circuit chip 602, where the feedback light returned by the resonator can cause injection locking of the second laser to the resonator to control the light emitted by the second laser.

When operated as part of an FMCW lidar sensor system, some of the channels of the system 600 may be chirped at the same bandwidth/speed or can be chirped at different bandwidths/speeds. Moreover, for different wavelength lasers chirped at the same chirp slope, detected signals can be processed to mitigate the impact of speckle from a target in the environment. Further, for lasers chirped at different rates or in different patterns, a common chipset can be used to cover different lidar use cases with regards to range and resolution.

According to various embodiments, a multi-channel coupling of on-chip source to electrooptic chip can be provided. Accordingly, multiple on-chip, narrow linewidth, low phase noise laser sources can be provided. Moreover, on-chip multiplexing for a single scanner beam of multiple wavelengths can be outputted. Further, different chirp ratios can be obtained for different FMCW sources utilizing a common system. The approaches herein provide for relatively low size, weight, power and cost as compared to conventional architectures.

Pursuant to an example, the multiple lasers 606-608 and resonators 610-612 can be utilized to provide a multiple beam laser source to increase pixel rate. For instance, in a lidar sensor system that includes the system 600, since multiple beams can be transmitted into an environment, an effective pixel rate within a scan time can be increased (relative to a lidar sensor system that transmits a single beam into the environment).

According to another example, optical frequencies of two or more of the lasers 606-608 can be offset from one another. Pursuant to an illustration, optical frequencies of each of the lasers 606-608 can be offset from the other lasers 606-608 in the array. Pursuant to another example, two or more of the lasers 606-608 can have substantially similar optical frequencies (e.g., non-offset optical frequencies). According to an illustration, it is contemplated that a first laser can have an optical frequency that is substantially similar to an optical frequency of a second laser, but differs from an optical frequency of a third laser.

Pursuant to an illustration, the laser 606 can have an optical frequency that is offset relative to an optical frequency of the laser 608. Accordingly, the laser 606 and the laser 608 can operate with slightly different wavelengths. Thus, the system 600 can provide an FMCW source that outputs multiple beams of slightly different wavelengths, which can be utilized to overcome problems such as speckle. For instance, a determination can be made that a first optical frequency of the laser 606 was deleteriously impacted, whereas a second optical frequency of the laser 608 was not similarly impacted. Thus, a return obtained responsive to the light emitted by the laser 608 operating at the offset, second frequency can be used. According to another example, averaging of the returns can be used.

According to another example, two or more of the resonators 610-612 can be modulated with different chirp patterns. Thus, different voltage waveforms can be applied to electrodes adjacent to the resonators modulated with the different patterns. For instance, chirp rates, slopes, and/or shapes of the voltage waveforms can be varied. Accordingly, different lasers 606-608 on the first integrated circuit chip 602 can be chirped at different rates, slopes, and/or functions to cover various use cases with regards to range, resolution, and detection speeds. For example, different chirp patterns can be used to tradeoff between short, midrange, and long-range detection of objects in an environment nearby the system 600.

Pursuant to another example, light emitted by two or more of the lasers 606-608 can be phase shifted relative to each other. For instance, the light emitted by the laser 606 (e.g., via a second path, transmitted to a lidar optical engine) can be phase shifted relative to the light emitted by the laser 608 (e.g., via a differing second path, transmitted to a differing lidar optical engine). According to an example, phase shifting of the outputs of the lasers 606-608 injection locked to the corresponding resonators 610-612 can enable providing beam steering, which can create a phased array. Thus, the phase shifting of the channels (e.g., by applying voltages to electrodes similar to the electrodes 218-220 and/or the electrodes 402-404 described herein) can enable the system 600 to provide beam steering.

In accordance with another example, channels can be switched on and off. For instance, a first channel at a first operating frequency can be used for certain environmental conditions, whereas a second channel at a second operating frequency can be used for differing environmental conditions.

Moreover, according to an example, it is contemplated that outputs from the channels of the system 600 can be averaged. Such averaging can mitigate noise. Further, averaging of the outputs from the different channels to enhance a signal to noise ratio of a return may be advantageous for automotive applications, where there oftentimes is not sufficient time to allow for averaging returns over time.

Figure 7:
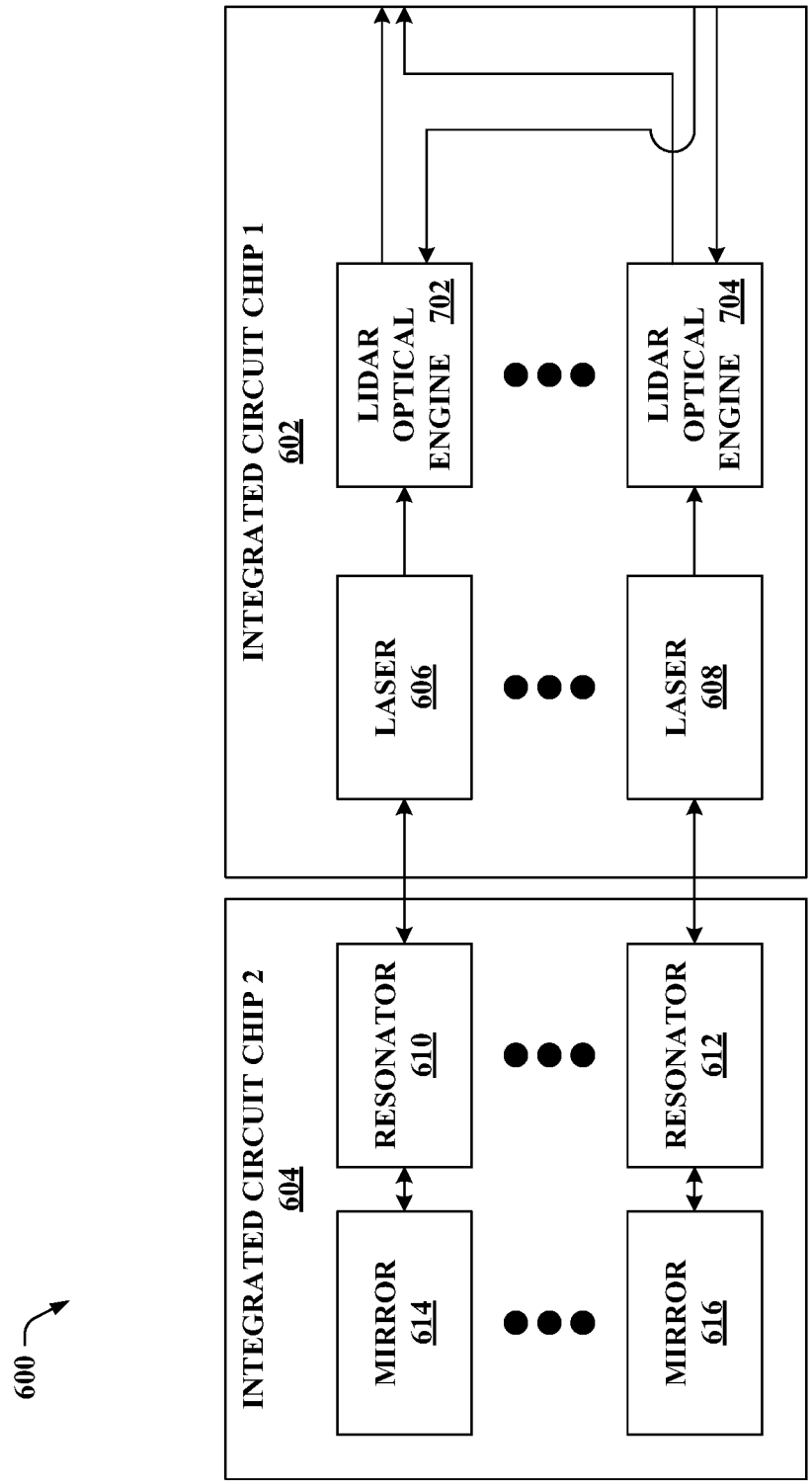
FIGS. 7-8 illustrate exemplary embodiments of the system for multiple channel, on-chip resonator to laser coupling of FIG. 6.

Now turning to FIG. 7, illustrated is an exemplary embodiment of the system 600 that includes the first integrated circuit chip 602 and the second integrated circuit chip 604. Again, the first integrated circuit chip 602 includes the lasers 606. Further, the second integrated circuit chip 604 includes the resonators 610-612 and the mirrors 614-614.

Each of the lasers 606-608 can be optically coupled to a corresponding lidar optical engine 702-704. Each of the lidar optical engines 702-704 can be substantially similar to the lidar optical engine 206 as described above. Accordingly, the resonators 610-612 can be injection locked to the lasers 606-608, such that feedback light returned by the resonators 610-612 to the lasers 606-608 cause injection locking of the lasers 606-608 to the resonators 610-612 to control light emitted by the lasers 606-608 and inputted to the corresponding lidar optical engines 702-704. Outputs from the lasers 606-608 in the second direction (e.g. away from the second integrated circuit chip 604) can be inputted into the corresponding lidar optical engines 702-704. Each of the lidar optical engines 702-704 can include a corresponding splitter, optical amplifier, output, return, interferometer, balanced detector, and the like.

As shown in FIG. 7, light beams outputted from the lidar optical engines 702-704 can be separately sent from the first integrated circuit chip 602. For instance, the light beams can be independently outputted to separate beam steerers. Likewise, returned light beams provided to the lidar optical engines 702-704 obtained responsive to the light beams outputted from the lidar optical engine 702-704 can be separate.

Figure 8:
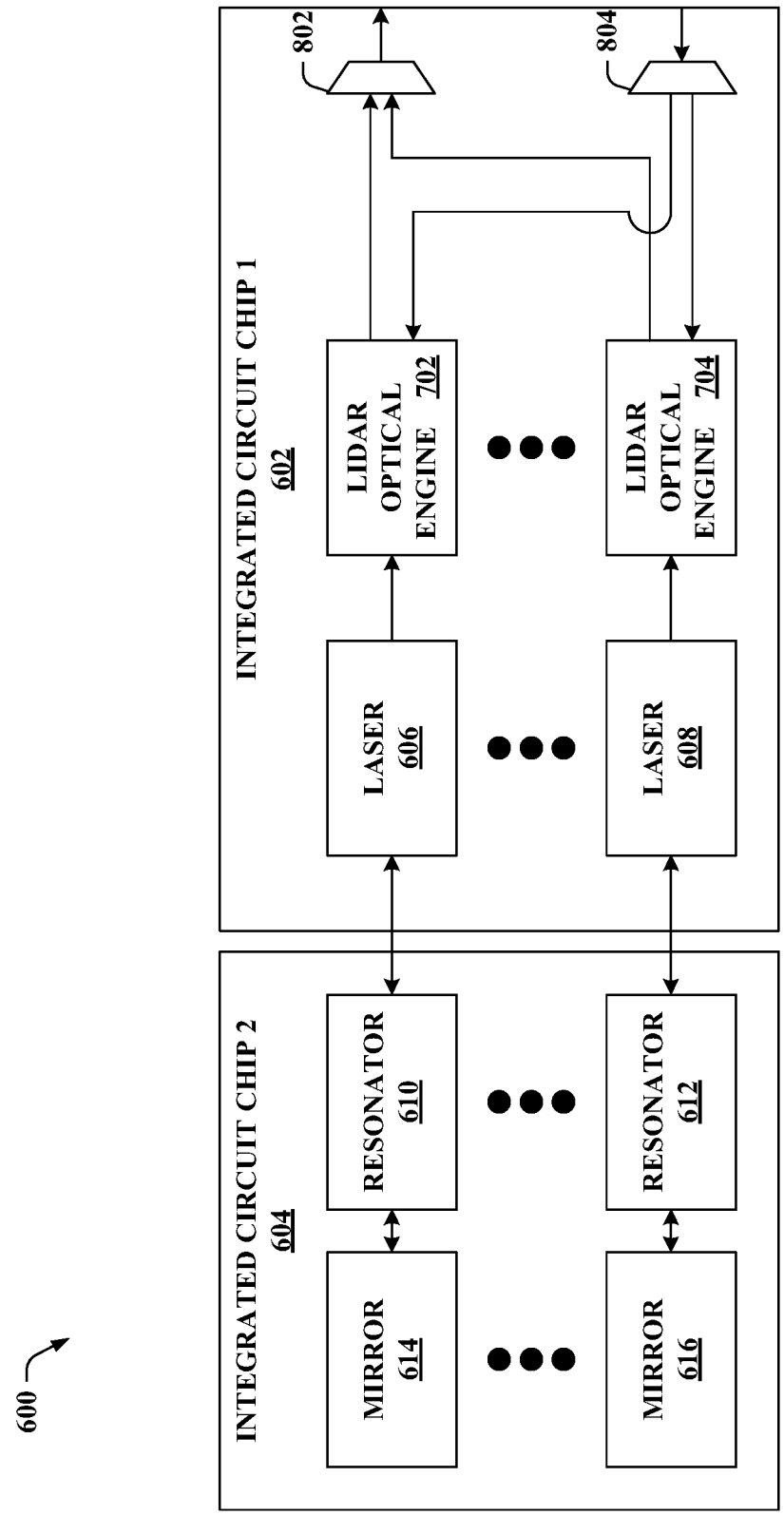

Now turning to FIG. 8, illustrated is yet another exemplary embodiment of the system 600 that includes the first integrated circuit chip 602 and the second integrated circuit chip 604. As depicted in FIG. 8, the first integrated circuit chip 602 can further include a multiplexer 802 and a demultiplexer 804. The multiplexer 802 can be configured to combine light beams outputted from the lidar optical engines 702-704 on a single output channel for transmission into an environment. The demultiplexer 804 can be configured to separate returned light beams received responsive to the transmission from the environment for the lidar optical engine 702-704 received on a single return channel. Accordingly, the light beams outputted by the lidar optical engine 702-704 can be multiplexed to provide a single output channel and demultiplexed on the return.

While not depicted in FIGS. 7-8, it is contemplated that these examples can be extended to a scenario where a single resonator is optically coupled to a plurality of lasers. For instance, the second integrated circuit chip 604 can include one resonator, which can be optically coupled to the lasers 606-608. According to another example, a first resonator of the second integrated circuit chip 604 can be optically coupled to more than one of the lasers 606-608, and a second resonator of the second integrated circuit chip 604 can be optically coupled to more than one of the lasers 606-608. It is also to be appreciated that a resonator of the second integrated circuit chip 604 can be optically coupled to more than one of the lasers 606-608, while a different resonator of the second integrated circuit chip 604 can be optically coupled to one of the lasers 606-608.

Pursuant to another example, it is contemplated that a first integrated circuit chip can include a laser and the second integrated circuit chip can include a resonator, where the laser and the resonator are optically coupled. Following this example, an output of the laser injection locked to the resonator can be split into multiple sources or channels. For instance, the multiple sources or channels outputted from the laser can be inputted to multiple lidar optical engines. According to this example, each of the multiple lidar optical engines can have light inputted thereto having substantially similar optical wavelengths (without an offset that may exist if differing lasers provide the light to the multiple lidar optical engines). Outputs from the multiple lidar optical engines can be separately outputted from the first integrated circuit chip (similar to FIG. 7) or combined (similar to FIG. 8).

Figure 9:
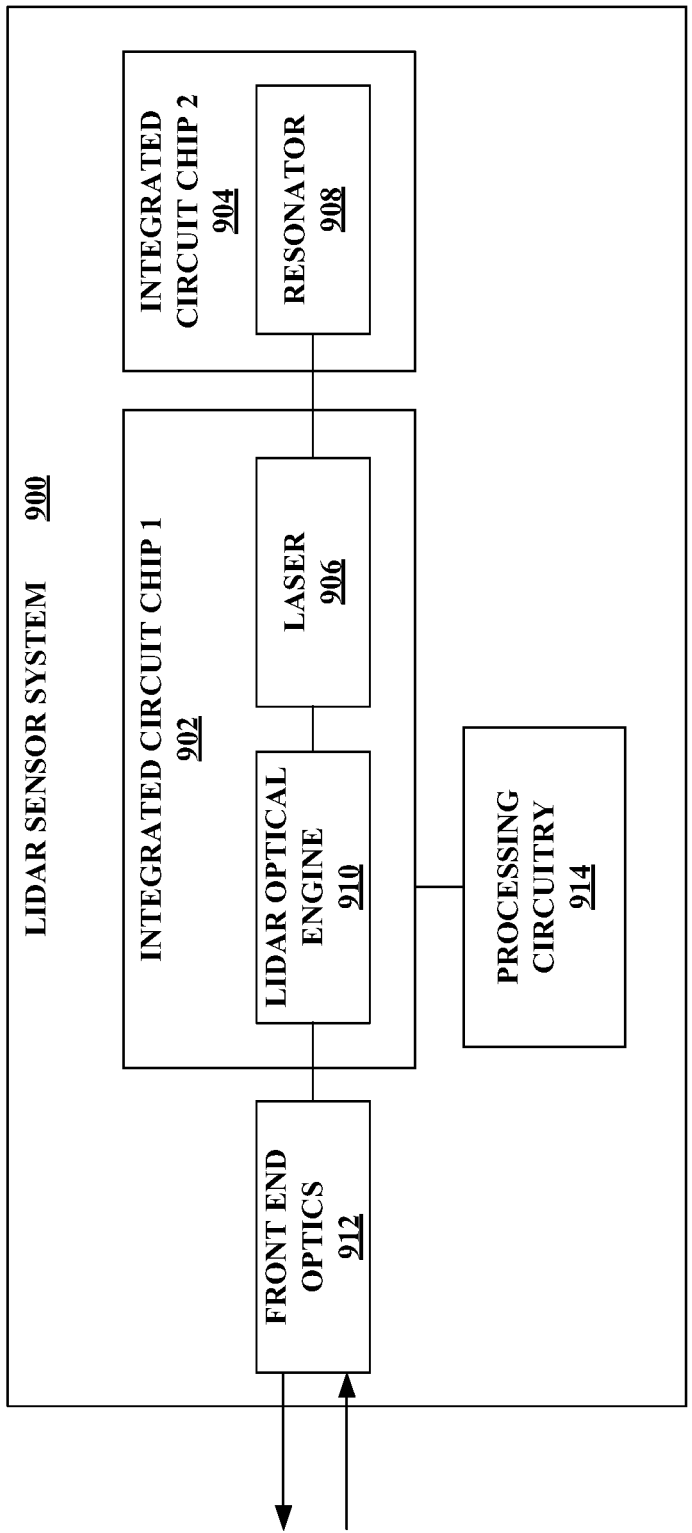
FIG. 9 illustrates a block diagram of an exemplary lidar sensor system that includes a laser injection locked to a resonator as described herein.

With reference to FIG. 9, illustrated is an exemplary lidar sensor system 900. The lidar sensor system 900 can be a frequency modulated continuous wave (FMCW) lidar sensor system; however, the claimed subject matter is not so limited. According to an example, an autonomous vehicle can include the lidar sensor system 900. However, it is to be appreciated that the claimed subject matter is not so limited.

The lidar sensor system 900 includes a first integrated circuit chip 902 (e.g., the first integrated circuit chip 106, the first integrated circuit chip 602) and a second integrated circuit chip 904 (e.g., the second integrated circuit chip 108, the second integrated circuit chip 604). The first integrated circuit chip 902 includes at least one laser 906, and the second integrated circuit chip 904 includes at least one resonator 908. The laser 906 is injection locked to the resonator 908. Moreover, the first integrated circuit chip 902 further includes at least one lidar optical engine 910.

The resonator 908 can include electrodes to which a voltage can be applied. Application of a voltage to the resonator 908 can change an optical property of the electrooptic material of the resonator 908. For instance, application of a voltage can change an index of refraction of the electrooptic material of the resonator 908. The laser 906 is optically injection locked to the resonator 908. Since the laser 906 is optically injection locked to the resonator device 908, a voltage applied to the resonator 908 can impart a frequency change on the laser 906.

The lidar sensor system 900 further includes front end optics 912 configured to transmit, into an environment of the lidar sensor system 900, at least a portion of an injection locked light beam outputted via the lidar optical engine 910 (e.g., generated from the light emitted by the laser 906). According to various examples, the front end optics 912 can include a scanner, which can direct an optical signal over a field of view in the environment. The front end optics 912 can also include other optical elements, such as one or more lenses, an optical isolator, one or more waveguides, an optical amplifier, and so forth. Such optical elements can enable generating the optical signal with desired properties such as collimation, divergence angle, linewidth, power, and the like. Such optical elements may be assembled discretely, or integrated on a chip, or in a combination of both. The front end optics 912 can also be configured to receive a reflected optical signal from the environment. The reflected optical signal can correspond to at least a part of the optical signal transmitted into the environment that reflected off an object in the environment.

As described herein, the lidar optical engine 910 can mix the reflected optical signal received by the front end optics 912 with a local oscillator portion of the injection locked light beam generated by the laser 906 injection locked to the resonator 908. Moreover, the lidar sensor system 900 can include processing circuitry 914, which can be configured to compute distance and velocity data of the object in the environment based on output of the lidar optical engine 910.

Figure 10:
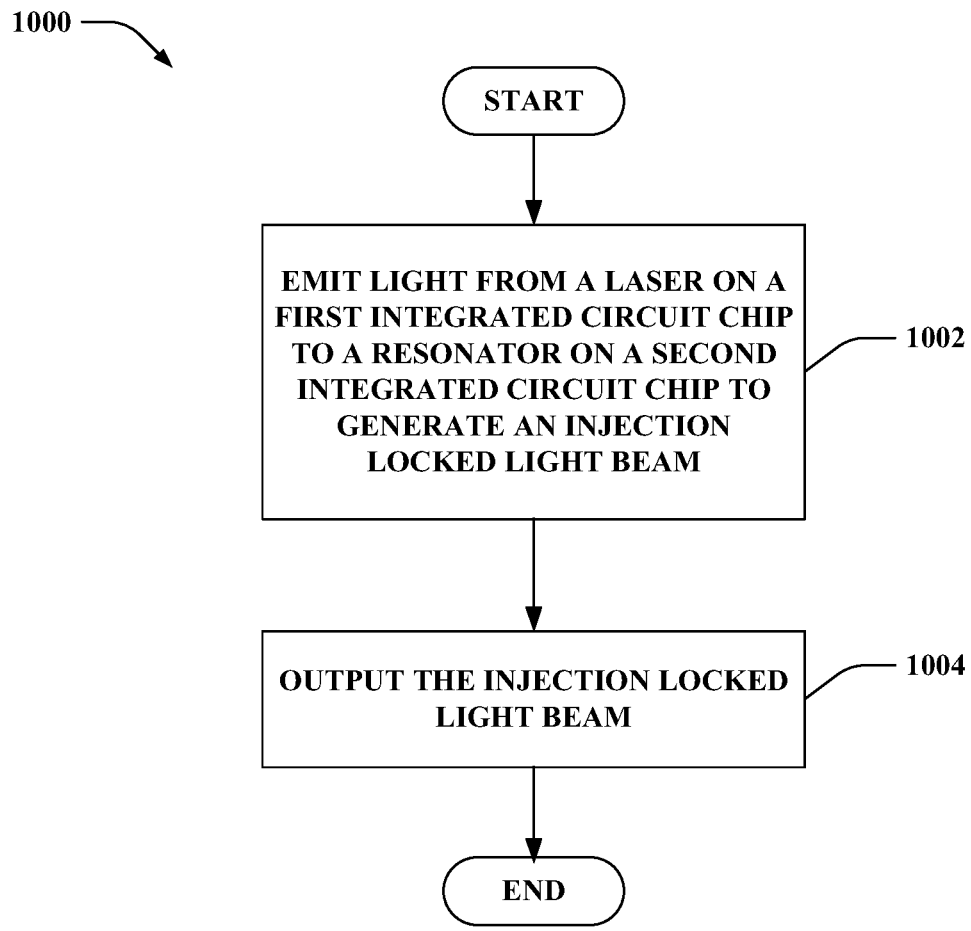
FIG. 10 is a flow diagram that illustrates an exemplary methodology of injection locking a laser to a resonator.

FIG. 10 illustrates an exemplary methodology related to injection locking a laser to a resonator. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

FIG. 10 illustrates a methodology 1000 of injection locking a laser to a resonator. At 1002, light from a laser on a first integrated circuit chip can be emitted to a resonator on a second integrated circuit chip to generate an injection locked light beam. The first integrated circuit chip and the second integrated circuit chip are separate integrated circuit chips. Moreover, the first integrated circuit chip and the second integrated circuit chip are optically coupled to each other. The resonator can receive the light from the laser and return feedback light to the laser. The feedback light can cause the laser to generate an injection locked light beam. At 1004, the laser can output the injection locked light beam.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An integrated circuit chip, comprising:
   a resonator formed of an electrooptic material, the resonator configured to receive light emitted by a laser and return feedback light to the laser, wherein a separate integrated circuit chip comprises the laser, and wherein the feedback light causes injection locking of the laser of the separate integrated circuit chip to the resonator to control the light emitted by the laser;
   a waveguide, wherein an end of the waveguide is configured to be optically coupled to the separate integrated circuit chip; and
   a mirror;
   wherein the resonator comprises:
      a first coupling region evanescently coupled to the waveguide; and
      a second coupling region evanescently coupled to the mirror.

2. The integrated circuit chip of claim 1, wherein the mirror is tunable to control an amount of light returned to the resonator.

3. The integrated circuit chip of claim 1, further comprising:
electrodes adjacent to the waveguide such that the waveguide is between the electrodes, wherein a change in voltage applied across the electrodes causes a corresponding phase shift of the feedback light returned to the laser.

4. The integrated circuit chip of claim 1, further comprising:
a detector coupled to the waveguide, the detector configured to detect alignment between the integrated circuit chip and the separate integrated circuit chip.

5. The integrated circuit chip of claim 1, wherein the resonator is a closed-loop waveguide.

6. The integrated circuit chip of claim 1, wherein the resonator has a width in a range from 1 micron to 3 microns.

7. The integrated circuit chip of claim 1, further comprising:
electrodes adjacent to the resonator such that the resonator is between the electrodes, wherein a change in voltage applied across the electrodes causes a corresponding change in frequency of a waveguide mode of the resonator.

8. The integrated circuit chip of claim 7, wherein the electrodes and the resonator are located in a common plane of the integrated circuit chip relative to a top surface of a substrate of the integrated circuit chip.

9. The integrated circuit chip of claim 7, wherein the electrodes and the resonator are vertically stacked in the integrated circuit chip relative to a top surface of a substrate of the integrated circuit chip.

10. The integrated circuit chip of claim 1, wherein the resonator is further configured to receive light emitted by a differing laser and return feedback light to the differing laser, wherein the separate integrated circuit chip further comprises the differing laser, and wherein the feedback light returned to the differing laser causes injection locking of the differing laser of the separate integrated circuit chip to the resonator to control the light emitted by the differing laser.

11. The integrated circuit chip of claim 1, further comprising:
a second resonator formed of the electrooptic material, the second resonator configured to receive light emitted by a second laser and return feedback light to the second laser, wherein the separate integrated circuit chip comprises the second laser, and wherein the feedback light causes injection locking of the second laser of the separate integrated circuit chip to the second resonator to control the light emitted by the second laser.

12. A system, comprising:
a first integrated circuit chip, comprising:
a first laser; and
a second laser; and
a second integrated circuit chip, the second integrated circuit chip and the first integrated circuit chip being separate integrated circuit chips, the second integrated circuit chip comprising:
a resonator formed of an electrooptic material, the resonator configured to:
receive light emitted by the first laser of the first integrated circuit chip and return feedback light to the first laser of the first integrated circuit chip, wherein the feedback light returned by the resonator causes injection locking of the first laser to the resonator to control the light emitted by the first laser; and
receive light emitted by the second laser of the first integrated circuit chip and return feedback light to the second laser of the first integrated circuit chip, wherein the feedback light returned by the resonator causes injection locking of the second laser to the resonator to control the light emitted by the second laser.

13. The system of claim 12, the first integrated circuit chip further comprises:
a multiplexer configured to combine the light emitted by the first laser and the light emitted by the second laser for transmission into an environment; and
a demultiplexer configured to separate returned light received responsive to the transmission from the environment.

14. The system of claim 12, wherein the light emitted by the first laser is phase shifted relative to the light emitted by the second laser.

15. The system of claim 12, wherein an optical frequency of the first laser is offset from an optical frequency of the second laser.

16. The system of claim 12, wherein the resonator is a closed-loop waveguide.

17. A method of injection locking a laser to a resonator, comprising:
emitting light from the laser on a first integrated circuit chip to the resonator on a second integrated circuit chip, the first integrated circuit chip and the second integrated circuit chip being separate integrated circuit chips, the first integrated circuit chip being optically coupled with the second integrated circuit chip,
wherein the resonator is configured to receive light emitted by the laser and return feedback light to the laser, and wherein the feedback light returned to the laser causes injection locking of the laser to the resonator to control the light emitted by the laser;
receiving feedback light from the resonator at the laser, the feedback light causes injection locking of the laser to the resonator; and
transmitting injection locked light outputted by the laser from the first integrated circuit chip into an environment.

18. The method of claim 17, further comprising:
controlling a change in voltage across electrodes to cause a phase shift of the feedback light.

19. The method of claim 17, further comprising:
controlling a change in voltage across electrodes adjacent to the resonator to cause a corresponding change in frequency of a waveguide mode of the resonator.

* * * * *